Figure 1:
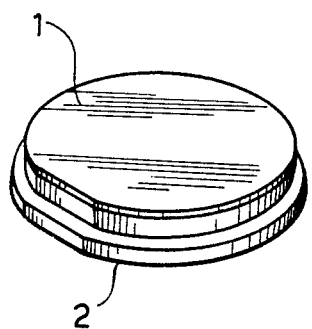

United States Patent [19]

Benini

[11] Patent Number: 4,771,261

[45] Date of Patent: Sep. 13, 1988

[54] METHOD FOR ACHIEVING THE ELECTRICAL AND MECHANICAL INTERCONNECTION OF TWO BODIES, PARTICULARLY THE DIAPHRAGM AND THE SUPPORT OF A THICK-FILM PRESSURE SENSOR, AND DEVICES MADE BY THIS METHOD

[75] Inventor: Luciano Benini, Cava Manara, Italy

[73] Assignee: Marelli Autronica S.p.A., Pavia, Italy

[21] Appl. No.: 13,099

[22] Filed: Feb. 10, 1987

[30] Foreign Application Priority Data

Feb. 10, 1986 [IT] Italy .............................. 67095 A/86

[51] Int. Cl.⁴ .............................................. G01L 1/22
[52] U.S. Cl. .......................................... 338/4; 338/2; 29/621.1
[58] Field of Search ................... 338/42, 4, 5, 36, 302; 29/610 SG, ; 73/774, 726, 727, 715, 862.64, 865.65; 361/397, 403

[56] References Cited

U.S. PATENT DOCUMENTS

| | | | |
|---|---|---|---|
| 3,875,478 | 4/1975 | Capstick | 361/403 |
| 4,321,578 | 3/1982 | Nagasu et al. | 338/42 |
| 4,410,927 | 10/1983 | Butt | 361/403 X |
| 4,628,409 | 12/1986 | Thompson et al. | 361/403 |
| 4,646,057 | 2/1987 | Reynolds | 338/302 |
| 4,670,733 | 6/1987 | Bell | 338/36 |

Primary Examiner—Clifford C. Shaw
Assistant Examiner—M. M. Lateef
Attorney, Agent, or Firm—Sughrue, Mion, Zinn, Macpeak & Seas

[57] ABSTRACT

A method for achieving mechanical and electrical interconnection of first and second bodies of which the first has at least one conductive element its surface intended to face the second and the second has a through-hole for electrical connection provided with a metallic coating intended for electrical connections to the conductive element of the first body includes applying layers of vitreous glue to corresponding surface portions of the first and second bodies. Moreover, a coating of conductive material in a vitreous matrix is deposited by the thick film technique on the surface of the second body intended to face the first, adjacent the through hole with the coating extending at least partly into the hole and electrically connected to the metallic coating of this hole. The bodies are then joined bring the respective layers of glue into contact with each other and the conductive coating of the second body into contact with the conductive element of the first. The two bodies thus joined are then passed through an oven where they are heated so as to achieve the simultaneous fusion of the layers of glue and the sintering of the conductive coating applied to the second body to adhere this coating to the conductive element carried by the first body.

6 Claims, 2 Drawing Sheets

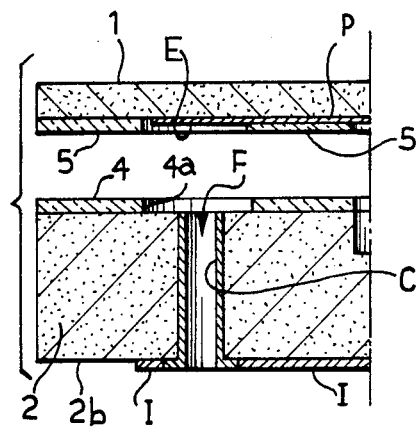
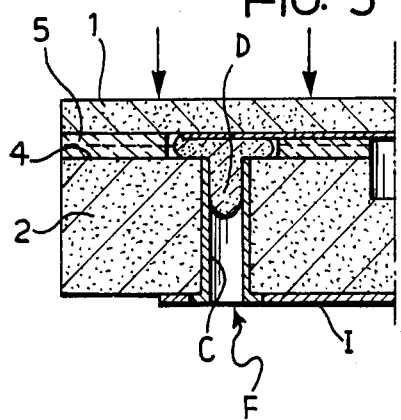
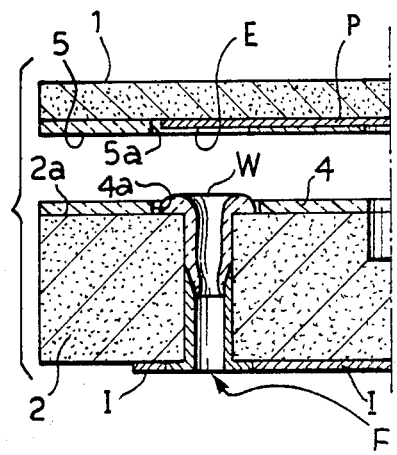
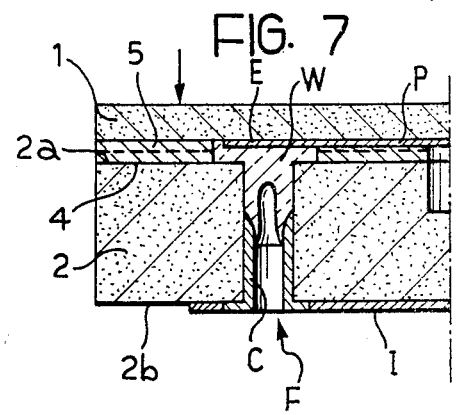

METHOD FOR ACHIEVING THE ELECTRICAL AND MECHANICAL INTERCONNECTION OF TWO BODIES, PARTICULARLY THE DIAPHRAGM AND THE SUPPORT OF A THICK-FILM PRESSURE SENSOR, AND DEVICES MADE BY THIS METHOD

DESCRIPTION

The present invention relates to a method for achieving the mechanical and electrical interconnection of a first body and a second body, particularly the diaphragm and the support of a pressure sensor, of which bodies the first carries at least one conductive element on its surface intended to face the second and the second has at least one electrical-connection through-hole between its surface facing the first body and the opposite surface, provided at least in part with an electrically-conductive coating intended for electrical connection to the conductive element of the first body.

Figure 2:
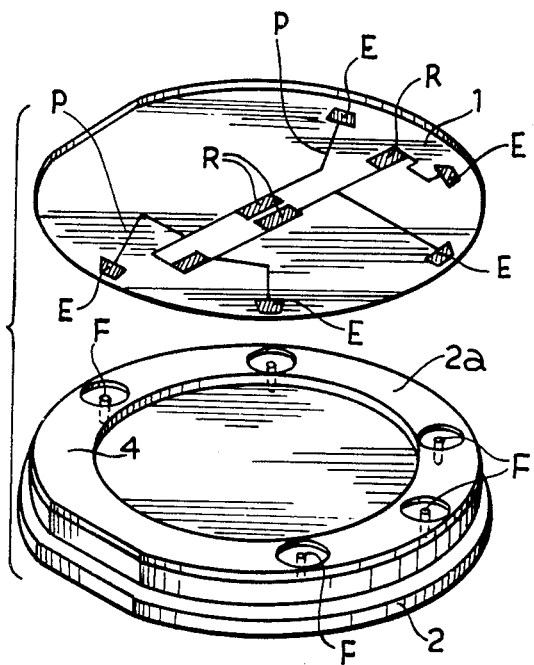
Figure 3:
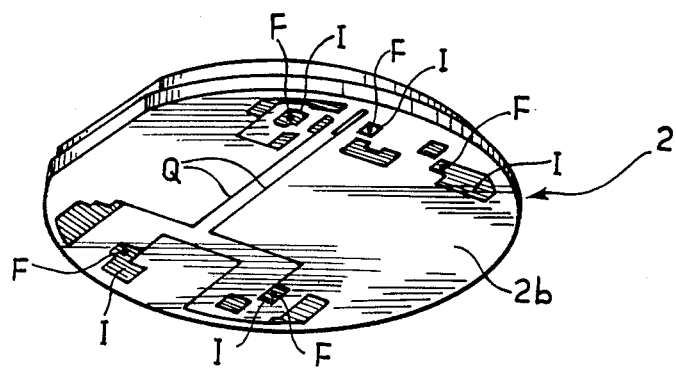

FIGS. 1 to 3 of the appended drawings illustrate a pressure sensor of the type including piezo-resistive transducer elements constituted by thick-film resistors. The known device illustrated includes a substantially circular diaphragm 1 constituted by a disc of very thin ceramics material, and a base support 2 which is also substantially circular and constituted by a ceramics material. The surface of the support 2 facing the diaphragm 1 (FIG. 2) has an annular peripheral projecting portion 2a. On its surface facing the support 2, the diaphragm 1 carries thick-film resistors R deposited by silk-screen printing, conductive tracks P connecting the resistors R, and small conductive parts or areas E spaced around the periphery of the diaphragm. The conductive tracks P and the areas E are also silk-screen printed on the diaphragm by the thick-film deposition method. As shown in FIG. 2, the support 2 has electrical-connection through-holes F in relative positions corresponding to the relative positions of the areas E of the diaphragm 1. Small areas of thick film conductive material, indicated I, are deposited by silk-screen printing on the lower surface 2b of the support 2 around the mouths of the holes F. Conductive tracks Q are also deposited by the thick-film method on the surface 2b of the support 2.

As seen from the partial section of FIG. 4, each hole F has a thin metallic coating C on its wall, which is connected to the respective conductive area I on the lower surface 2b of the support 2.

In order to make the known sensor shown in FIGS. 1 to 5, the manufacturing process currently used provides initially for the deposition of the tracks P and the conductive areas E on the diaphragm 1 and on the support 2, by silk-screen printing, and then the deposition of the thick-film resistors R, again by silk-screen printing. The tracks Q and the areas I are then deposited by silk-screen printing on the lower surface 2b of the support 2, and at the same time the holes F are metallised. The diaphragm is then fixed to the projecting portion 2a of the support 2 in the following manner. A thin layer of vitreous glue 4 is deposited by silk-screen printing on the projecting portion 2a of the support 2, this layer having apertures 4a centered around the mouths of the holes F. A corresponding layer of vitreous glue 5 is deposited by silk-screen printing on the peripheral annular portion of the surface of the diaphragm 1 intended to face the support 2. The diaphragm 1 is then placed against the support 2, the respective layers 5 and 4 being brought into contact with each other. The layers of glue are then heated by passage through an oven so that they fuse and establish the firm and reliable anchoring of the diaphragm to the support. Once these operations have been carried out, a certain quantity of conductive resin, indicated D in FIG. 5, is injected into the holes F by means of a syringe. The injected conductive resin, after polymerisation, for example in an oven, forms the electrical connection between the conductive areas E carried by the diaphragm and the conductive coating C of the walls of the holes F, and hence connects the resistors R acting as piezo-resistive transducers to the conductive areas applied to the lower surface of the support 2. These areas may then be connected to electronic circuits for monitoring the variations in the resistances of the resistors.

In the manufacturing process described above, the method of achieving the electrical connections between the conductive areas E of the diaphragm and the metallic coating of the connecting holes F of the support is not at all satisfactory. In effect, the conductive resins used, which are typically of the organic matrix type, bond to the inorganic metallic coating of the holes F of the support and to the inorganic material forming the conductive areas E of the diaphragm 1 in a manner which is not always absolutely secure and reliable. Moreover, the injection of the conductive resin into the holes is not very easy and affects the overall manufacturing times of the sensors to an appreciable extent.

The object of the present invention, therefore, is to provide a method of the type specified above, which enables the mechanical and electrical interconnection of two bodies having the characteristics defined previously, particularly the diaphragm and the support of a pressure sensor of the type described above, to be achieved more quickly, safely and reliably.

This object is achieved according to the invention by means of a method of the type specified above, the main characteristic of which lies in the fact that, before the juxtaposition of the bodies, a coating of electrically-conductive material in a vitreous matrix is deposited on the surface (2a) of the second body intended to face the first body, adjacent the at least one hole, coating extending at least partly into the hole and is being connected to the metallic coating of the hole; the bodies subsequently being juxtaposed with the respective layers of glue in contact with each other and the conductive coating of the second body in contact with the conductive element of the first body: the bodies then being heated so as to achieve the simultaneous fusion of the layers of glue and the sintering of the conductive coating applied to the second body, and the adhesion of this coating to the conductive element of the first body.

The invention also concerns devices made by this method.

Further characteristics and advantages of the invention will become apparent from the detailed description which follows with reference to the appended drawings, provided purely by way of non-limiting example, in which:

FIG. 1, already described, is a perspective view of a pressure sensor to which the method of the invention can be applied, FIG. 2, already described, is an exploded perspective view of the pressure sensor shown in FIG. 1, FIG. 3, already described, is a perspective view of the sensor of FIG. 1 from below, FIGS. 4 and 5, already described, are partial sections on an enlarged scale, showing the diaphragm and the support of the sensor of FIG. 1 before and after their mechanical and electrical connection according to the previous processes, and FIGS. 6 and 7 are partial sectional views similar to those of FIGS. 4 and 5, illustrating the diaphragm and the support of the sensor of FIG. 1 before and after their connection by the method of the invention.

In order to make a pressure sensor of the type described above in accordance with the invention, a diaphragm 1 and a support 2 are arranged substantially in the manner described previously. In particular, the conductive tracks P and the areas E are deposited first of all on the diaphragm 1 by the thick-film technique. This is followed by a phase of baking in an oven. Thick-film resistors R are then silk screen printed on the diaphragm. There follows a further passage through an oven. The layer of vitreous glue 5 is then also deposited by the silk-screen technique, the circular or elliptical areas 5a corresponding to the conductive areas E being left free. Similarly, the tracks Q and the conductive areas I are first silk-screen printed on the support 2 and the walls of the holes F are then metallised. The support is then passed through an oven. The layer of vitreous glue 4 is then deposited on the annular projecting portion 2a, the areas 4a around the mouths of the holes F being left free. After this sequence of operations, the diaphragm 1 and the support 2 assume the respective configurations shown in FIG. 4.

According to the invention, before the juxtaposition of the diaphragm and the support, conductive coatings are deposited by silk-screen printing, on the annular projecting portion 2a of the support in the apertures 4a left free of glue 4. Such a coating is shown, for example, in FIG. 6, where it is indicated W. This coating is preferably constituted by a conductive thick-film paste incorporating particles of metal in a vitreous matrix. Each coating is made by the deposition of a small quantity of such a conductive paste on the upper mouth of a hole F, a low pressure being applied at the same time to the lower mouth of this hole so that at least some of this material is sucked onto the walls of the hole itself. The coating W thus extends over the edges of the upper mouth of the hole F and into the hole, being superposed on the metal coating C. After their deposition on the support 2, the conductive coatings W are dried, being kept, for example, at 150° C. for 20 to 30 minutes.

Tests carried out by the inventors have indicated that the optimum thicknesses (when dried) of the various elements or layers deposited on the diaphragm 1 and on the support 2 are within the following ranges:

thickness of the conductive elements E: 5–15 microns, and preferably 10–12 microns;

thickness of the layer of glue S deposited on the diaphragm 1: 15–30 microns, preferably 20–25 microns;

thickness of the layer of glue 4 deposited on the support 2: 5–15 microns, preferably 10–12 microns;

thickness of the conductive coatings W: 15–40 microns.

It has also been found that the best results are achieved when the sum of the thicknesses of the conductive elements E and the coatings W are greater than the sum of the thicknesses of the layers of glue 4 and 5 by an amount of between 4 and 25 microns.

After drying, the diaphragm 1 can be placed against the support 2 so that the respective layers of vitreous glue 4-5 face each other and the annular top portions of the conductive coatings W are in contact with the corresponding conductive areas E of the diaphragm 1.

The support and the diaphragm placed thereon are then passed through an oven where they are brought to a temperature such as to cause remelting of the layers of vitreous glue 4, 5 which coalesce and achieve a stable bond by sintering of the materials constituting the conductive coatings W and the conductive areas E. The bond achieved in this manner is a vitreous matrix and is thus extremely firm and stable.

In the method of the invention, therefore, it is no longer necessary to inject conductive resin and subsequently polymerise it. Moreover, from both a mechanical point of view and an electrical point of view, the connection between the conductive areas E of the diaphragm 1 and the metallic coating C of the support is much firmer and more reliable. The formation of the metallic coating of the walls of the connecting holes F is also much less critical in that, due to the suction of the material constituting the coatings W into the holes F during the deposition of these coatings, it is no longer strictly necessary for the conductive coating C of the holes to extend perfectly over the entire axial length of the holes.

The deposition of the conductive coating W by silk-screen printing can be carried out very easily and quickly.

Finally, the method of the invention enables a reduction in the number of steps necessary to make, for example, the pressure sensor illustrated, with consequent cheapness of manufacture. Moreover, it ensures the formation of much firmer and more reliable mechanical and electrical connections than is possible by the processes of the prior art.

Although the method of the invention has been described with reference to the formation of a pressure sensor in the above description, it is clear that, in its wider sense, the method is not in fact intended to be limited to the formation of only this type of device.

Naturally, the principle of the invention remaining the same, the forms of embodiment and details of realization may be varied widely with respect to that described and illustrated purely by way of non-limiting example, without thereby departing from the scope of the present invention.

I claim:

1. A method for achieving the mechanical and electrical interconnection of a first body and a second body particularly but not exclusively the diaphragm and the support of a pressure sensor, of which the first body carries at least one conductive element on its surface intended to face the second body and the second body has at least one electrical-connection through-hole between its surface facing the first body and the opposite surface, the hole being provided at least in part with an electrically-conductive coating intended for electrical connection to the conductive element of the first body, the method including the steps of applying respective layers of vitreous glue to corresponding surface portions of the first and second bodies juxtaposing the bodies, the respective layers of glue being placed in contact with each other, and heating the layers of glue so as to cause their fusion, wherein the improvement consists in the deposition of a coating of electrically-conductive material in a vitreous matrix on the surface of the second body intended to face the first body, adjacent the at least one hole, prior to the juxtaposition of the bodies, the coating extending at least partly into the hole and being connected to the coating of the hole, the bodies subsequently being juxtaposed with the respective layers of glue facing each other and the conductive coating of the second body, in contact with the corresponding conductive element of the first body, the bodies then being heated so as to achieve the simultaneous fusion of the layers of glue and the sintering of the conductive coating applied to the second body and the adhesion of this coating to the conductive element of the first body.

2. A method according to claim 1, wherein the at least one coating is deposited by the thick-film technique.

3. A method according to claim 2, wherein the thickness of the layer of glue deposited on the first body is between 15 and 30 microns, the thickness of the layer of glue deposited on the second body is between 5 and 15 microns, the thickness of the at least one conductive element of the first body is between 5 and 15 microns, and the thickness of the at least one conductive coating (W) is between 15 and 40 microns.

4. A method according to claim 3, wherein the layers of glue have thicknesses of between 20 and 25 microns and 10 and 12 microns respectively, and that at least one conductive element has a thickness of between 10 and 12 microns.

5. A method according to claim 3, wherein the sum of the thicknesses of the at least one conductive element and the at least one coating is greater than the sum of the thicknesses of the layers of glue.

6. A method according to claim 4, wherein the sum of the thicknesses of the at least one conductive element and the at least one coating is greater than the sum of the thicknesses of the layers of glue by 4–25 microns.

* * * * *